United States Patent

Verhaar et al.

[11] Patent Number: 6,069,033
[45] Date of Patent: May 30, 2000

[54] METHOD OF MANUFACTURING A NON-VOLATILE MEMORY AND A CMOS TRANSISTOR

[75] Inventors: Robertus D. J. Verhaar; Guido J. M. Dormans, both of Eindhoven, Netherlands

[73] Assignee: U.S. Philips Corporation, New York, N.Y.

[21] Appl. No.: 09/044,544

[22] Filed: Mar. 19, 1998

[30] Foreign Application Priority Data

Apr. 1, 1997 [EP] European Pat. Off. .............. 97200945

[51] Int. Cl.[7] ............................................... H01L 21/8247
[52] U.S. Cl. ............................................ 438/201; 438/258
[58] Field of Search ..................................... 438/201, 211, 438/258, 264, 587, 588, 593, 594

[56] References Cited

U.S. PATENT DOCUMENTS

| | | | |
|---|---|---|---|
| 4,780,431 | 10/1988 | Maggioni et al. | 438/258 |
| 5,153,143 | 10/1992 | Schlais et al. | 438/201 |
| 5,223,451 | 6/1993 | Uemura et al. | 438/201 |
| 5,395,778 | 3/1995 | Walker | 437/43 |
| 5,449,634 | 9/1995 | Inoue | 438/258 |
| 5,472,892 | 12/1995 | Gwen et al. | 438/258 |

*Primary Examiner*—Chandra Chaudhari
*Attorney, Agent, or Firm*—Brian J. Wieghaus

[57] ABSTRACT

The invention provides a method of combining an EPROM (or EEPROM) with a standard CMOS process. After growing the gate oxide 9, a lightly doped polycrystalline or amorphous silicon layer 10, hereinafter referred to as poly I, is deposited. In this layer, the floating gate 13 of the memory cells is defined, while, outside the memory matrix, the surface remains covered with poly I. Subsequently, the source/drain implantation in the memory cells is carried out. The poly layer 10 situated outside the memory matrix is masked against this heavy implantation by the mask 11. Subsequently, a second poly layer can be provided from which the control gates of the memory cells are formed and which forms a coherent layer with the existing poly I layer outside the matrix. In a subsequent series of steps in a standard CMOS process, the n-ch MOSTs and p-ch MOSTs are provided, n-type gates 22 for the n-ch MOSTs and p-type gates 23 for the p-ch MOSTs being formed from the poly I layer.

10 Claims, 3 Drawing Sheets

METHOD OF MANUFACTURING A NON-VOLATILE MEMORY AND A CMOS TRANSISTOR

BACKGROUND OF THE INVENTION

The invention relates to a method of manufacturing a semiconductor device comprising a semiconductor body one surface of which is provided with a pair of transistors in the form of an n-channel MOST in a first active region and a p-channel MOST in a second active region, in combination with a non-volatile memory cell in the form of a MOST having a floating gate in a third active region. Customarily, the MOST having a floating gate is an n-channel transistor, but it may of course also be a transistor with a p-channel. Such a method is disclosed, inter alia, in U.S. Pat. No. 5,395,778, in the name of the current applicant. In said patent, a description is given of a method which can very advantageously be used in the manufacture of an integrated circuit having an embedded, non-volatile memory, in which method a standard CMOS process for the digital signal processing logic is used to provide such a circuit "on chip" with a memory by adding as few extra steps as possible. To optimize the properties of the memory, for example as regards the write efficiency, without adversely affecting the properties of the logic, in a first series of steps the major part of the memory transistor having the floating gate and the source and drain zones are formed, while the region in which the logic is provided at a later stage remains covered by a layer of polycrystalline (poly) or amorphous silicon from which the floating gate is made.

The various embodiments of this known process are such that transistors of the n-channel type and of the p-channel type are formed in the logic, which transistors both comprise an n-type doped poly gate electrode. However, it is often desirable, for example in connection with the threshold voltage of the transistor, that the n-channel transistor has an n-type gate and the p-channel transistor has a p-type gate. When an n-type gate is employed in the p-channel transistor, a buried channel is often formed, as a result of which an additional voltage is necessary to bring the transistor into the off-state. This may be undesirable, in particular, when the channel length is very small, for example 0.5 µm or less, in which case also a lower supply voltage is used.

SUMMARY OF THE INVENTION

It is an object of the invention to provide, inter alia, a method by which an integrated circuit, for example a microcontroller, can be obtained in which the combination of CMOS logic and a non-volatile memory is optimized, and in which the complementary transistors of the logic are provided with gate electrodes of complementary conductivity types.

To achieve this, a method of the type mentioned in the opening paragraph is characterized, in accordance with the invention, by the following steps:

providing a gate dielectric onto the surface of the semiconductor body in the first, second and third active regions;

forming a semiconductor layer with a relatively low dopant concentration on the dielectric layer;

providing a mask which defines the floating gate in the semiconductor layer and which masks the parts of the semiconductor layer of the first and the second active region;

etching of unmasked parts of the semiconductor layer thereby providing the floating gate with a pattern and removing the semiconductor layer situated above surface parts of the third active region next to the floating gate, while the first and the second active region remain completely covered by the semiconductor layer;

providing a dopant having a relatively high dopant concentration in the uncovered parts of the third active region so as to obtain source and drain zones of a specific conductivity type for the MOST having a floating gate, during this doping step, at least portions of the semiconductor layer situated above the first and the second active region being masked against doping;

forming the gates of the n-channel MOST and the p-channel MOST, and providing the n-type source and drain zones of the n-channel MOST and the p-type source and drain zones of the p-channel MOST by locally providing (a) dopant(s);

providing the semiconductor layer situated above the first active region with an n-type dopant and the semiconductor layer situated above the second active region with a p-type dopant.

It is noted that the gate dielectric does not necessarily have to be a uniform layer. The layer may be, for example, locally very thin and form a tunnel oxide in the case of an EEPROM.

The memory can be optimized and, at the same time, degradation of the properties of the transistors of the logic can be avoided, as described in the above-mentioned patent U.S. Pat. No. 5,395,778, by first carrying out the above steps for the manufacture of the non-volatile memory, while the surface region where the logic is provided is masked with poly or amorphous silicon, and subsequently providing the transistors of the logic. By additionally employing, in accordance with the invention, a semiconductor layer (poly or amorphous silicon) having a relatively low dopant concentration and masking this layer at the location of the logic during the source/drain implantation in the memory cell, it is precluded that this relatively high dopant concentration reaches the masked portions of the poly layer. By virtue thereof, the gate of the p-channel MOST can be given a p-type doping and the gate in the n-channel MOST can be given an n-type doping at a later stage in the process.

An embodiment of a method in accordance with the invention in which the number of process steps is minimized is characterized in that the gate of the n-channel MOST is doped at the same time as the n-type source and drain zones of the n-channel MOST, and in that the gate of the p-channel MOST is doped at the same time as the p-type source and drain zones of the p-channel MOST.

Under certain conditions it may be advantageous to employ a p-type floating gate, however, customarily an n-type floating gate is used. Therefore, a further embodiment of a method in accordance with the invention is characterized in that the semiconductor layer is provided with a relatively weak n-type dopant concentration, with the portion of the semiconductor layer which forms the gate of the p-channel MOST being redoped by giving it a p-type doping.

The invention can be advantageously used in memories which are erased by exposure to UV light. A further important embodiment of a method in accordance with the invention, which can be used, inter alia, if the memory can be erased electrically, is characterized in that the memory cell is provided with a control electrode which is situated above the floating gate and which is separated from said gate by an intermediate electrically insulating layer, a second semiconductor layer being provided for the control electrode, which semiconductor layer forms a continuous semiconductor layer with the above-mentioned first semiconductor layer at the location of the first and the second active region, and the gates of the n-channel MOST and the p-channel MOST being formed from this common semiconductor layer. A preferred embodiment is characterized in that the second semiconductor layer is provided by deposition of a first partial layer and a second partial layer, after the first deposition operation and before the second deposition operation, portions of the first partial layer situated above the first and the second active region being removed, so that at the location of these active regions, the second partial layer is deposited directly onto the first semiconductor layer. Preferably, the first semiconductor layer and the first and the second partial layer of the second semiconductor layer are equally thick or almost equally thick because this favorably influences the definition of the gates of the transistors.

These and other aspects of the invention will be apparent from and elucidated with reference to the embodiments described hereinafter.

DETAILED DESCRIPTION OF THE PREFERRED EMBODIMENT

Figure 1:
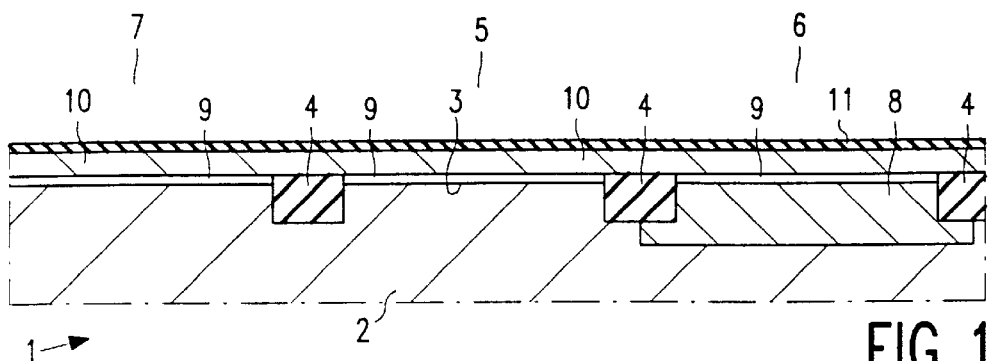
FIGS. 1–10 show a cross-sectional view of a semiconductor device during various stages of its manufacture by means of a method in accordance with the invention.

For the starting material use is made of a silicon semiconductor body 1 having a region 2 of a specific conductivity type, in this example the p-type, which is adjacent to the surface 3. Said region 2 may be formed by a relatively lightly doped epitaxial layer having a thickness, approximately, of 4 $\mu$m and a specific resistance, for example, of 10 Ohm.cm on a highly doped p-type substrate. The region 2 is provided, in a customary manner, with a pattern of thick field oxide 4 which is recessed, over at least a part of its thickness, in the semiconductor body 1. The field oxide 4 defines three active regions 5, 6 and 7 in the surface region 2. As will be described hereinbelow, an n-channel MOST is provided in the first active region 5, a p-channel MOST is provided in the second active region 6, and a memory cell in the form of an n-type MOST having a floating gate is provided in the third active region 7. For the p-channel MOST, the active region 6 is customarily provided with an n-type well 8. If necessary, the active region may be similarly provided with a p-type well (not shown in the drawing). By means of oxidation, the surface 3 is provided with an oxide layer 9 having a thickness, for example, of 12 nm, which forms the gate oxide of the MOS transistors to be provided. Subsequently, a semiconductor layer 10 is provided from which, at a later stage, the gate electrodes of the transistors are formed. To distinguish this layer from other layers to be provided, it will hereinafter be referred to as poly I. It is noted, however, that for the layer 10, and for the other silicon layers to be provided, use can be made, for example, of amorphous silicon instead of polycrystalline silicon. The thickness of the poly I layer 10 is, for example, 150 nm. By the implantation of P ions having an implantation dose of $2.10^{14}$ per cm$^2$, a relatively lightly n-type doped layer 10 is obtained. By deposition from the gas phase, the layer 10 is provided with a layer 11 which provides a mask against oxidation, in this example a layer of silicon oxynitride having a thickness of 35 nm. This stage of the manufacture of the device is shown in FIG. 1.

Figure 2:
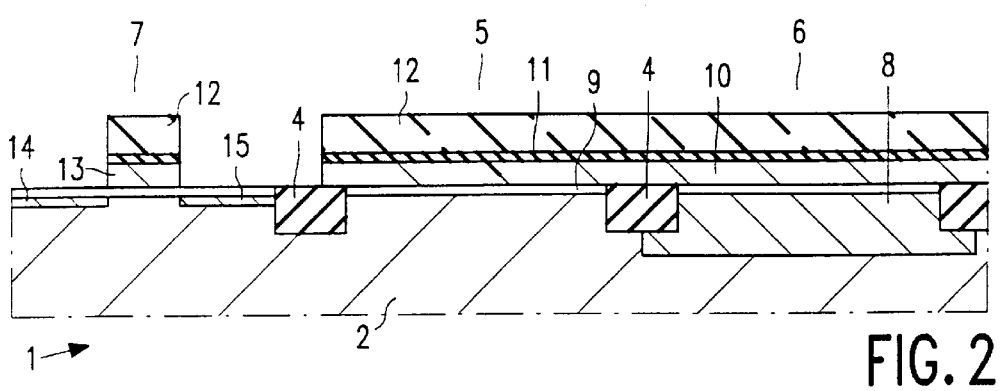
Figure 3:
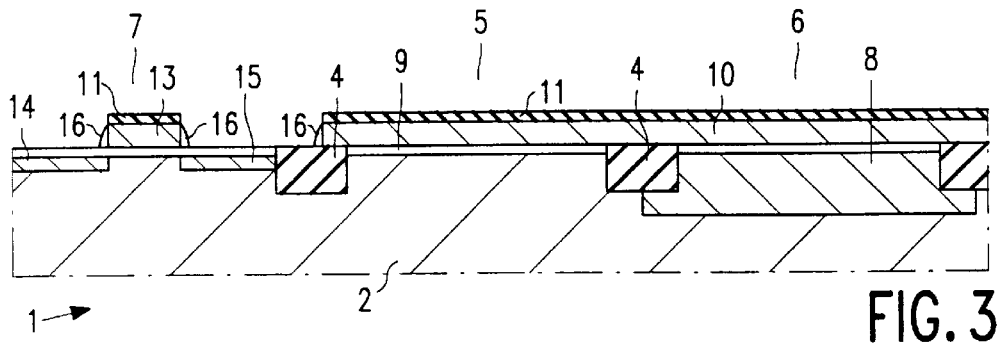

Subsequently, a photoresist layer is applied from which a mask 12 (FIG. 2) is formed which entirely covers the first and the second active region 5 and 6, respectively, and which defines the floating gate of the memory cell in the active region 7. The parts of the oxynitride layer 11 and the poly I layer 10 which are not masked by the mask 12 are removed by etching, thereby forming the floating gate 13 of the memory cell. Subsequently, by implantation of As ions, the source and drain zones 14 and 15 of the MOST having a floating gate are provided next to the floating gate, said zones having a dopant concentration, for example, of $3.10^{15}$ atoms per cm$^2$. During this implantation step, the poly I material in the active regions 5 and 6 is masked by the resist layer 12, so that the dopant concentration in these parts of the poly I layer remains relatively low and the poly layer can be locally redoped at a later stage in the process. After the implantation of the source and the drain of the memory transistor, the photoresist mask 12 is removed. Subsequently, in an oxidation step, the side walls of the poly I layers are covered with a thin oxide layer 16 having a maximum thickness of approximately 10 nm. During this oxidation step, the upper side of the poly layer 10 is masked against oxidation by the oxynitride layer 11. The thickness of the oxide above the source and drain zones 14, 15 may increase slightly, as shown in FIG. 3, and the oxide may extend below the floating gate 13. FIG. 3 shows the device obtained at this stage of the process.

Figure 4:
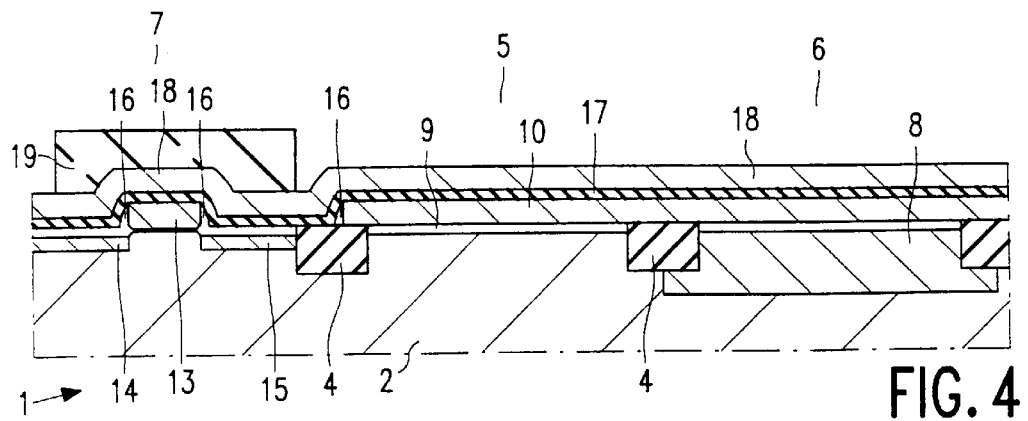

Subsequently, the oxynitride layer 11 is removed and the whole is covered with a new silicon oxynitride layer 17 (FIG. 4) from which, at a later stage, the interpoly dielectric between the floating gate and the control electrode of the memory transistor is formed. Of course, it is alternatively possible to use another, suitable electrically insulating material for this interpoly dielectric. The thickness of the layer 17 is, for example, 35 nm. A polycrystalline or amorphous silicon layer 18 (poly II) is applied in a thickness of 150 nm to the layer 17 by deposition from the gas phase. This layer is n-type doped by implantation of P ions having, in this example, an implantation dose of $2.10^{14}$ atoms per cm$^2$. If desirable, it is alternatively possible to use another, higher implantation dose. Subsequently, a photoresist mask 19 is provided which covers poly II in the active region 7 and which leaves poly II in the active regions 5 and 6 uncovered. The stage thus obtained is shown in FIG. 4.

Figure 5:
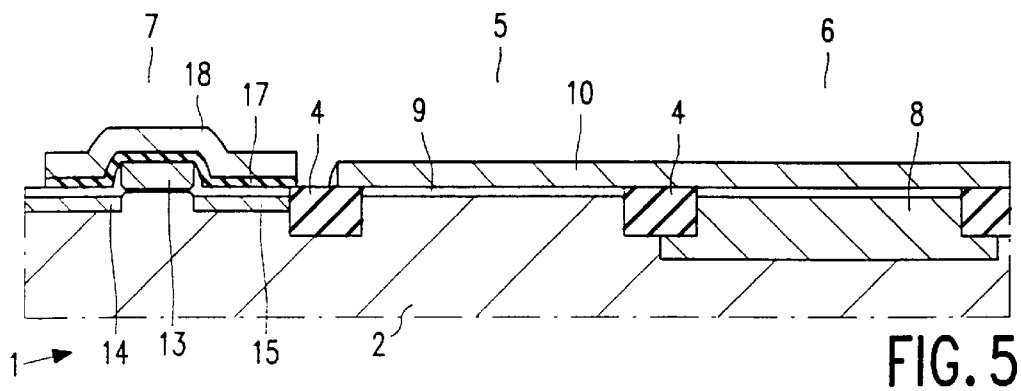

The poly II which is not covered by the mask 19 is then removed by etching, i.e. all of the poly II situated above the active regions 5 and 6. Subsequently, also the exposed parts of the silicon oxynitride layer 17 are removed, so that the poly I of the layer 10 in the active regions 5 and 6 is exposed. After these etching steps, the mask 19 can be removed, as shown in FIG. 5. In an alternative embodiment, the mask 19 can be removed after etching of the poly layer 18, whereafter, using the remaining poly of the layer 18 as a mask, the unmasked parts of the oxynitride layer 17 are removed.

Figure 6:
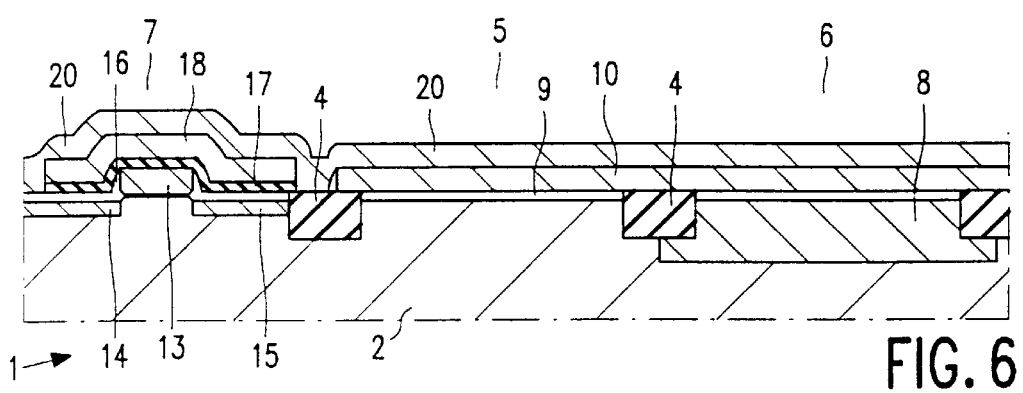

In a subsequent step, a third polycrystalline or amorphous silicon layer 20, referred to as poly III, is deposited, see FIG. 6. This layer has a thickness of 150 nm and is provided with a light n-type doping by implantation with P ions having an implantation dose of $2.10^{14}$ per cm$^2$. It is noted that, in the active regions 5 and 6, poly III forms a coherent layer with poly I and, in the active region 7, the poly III layer forms a coherent layer with poly II. As the thicknesses of poly I and poly II are the same, the thickness of the combination of poly I and poly III in the active regions 5 and 6 is equal to the thickness of the combination of poly II and poly III in the memory transistor. This has the advantage that the control electrode of the memory cell and the gates of the CMOS transistors can be simultaneously patterned by means of the same photolithographic steps, thereby avoiding problems which often arise when layers of different thicknesses are simultaneously provided with a pattern. In addition, by providing the three poly layers with equal dopant concentrations, substantially homogeneous layers are obtained, while the interfaces between the poly layers hardly, if at all, influence, for example, the resistance of the combination poly I, poly II and of the combination poly I, poly III.

Figure 7:
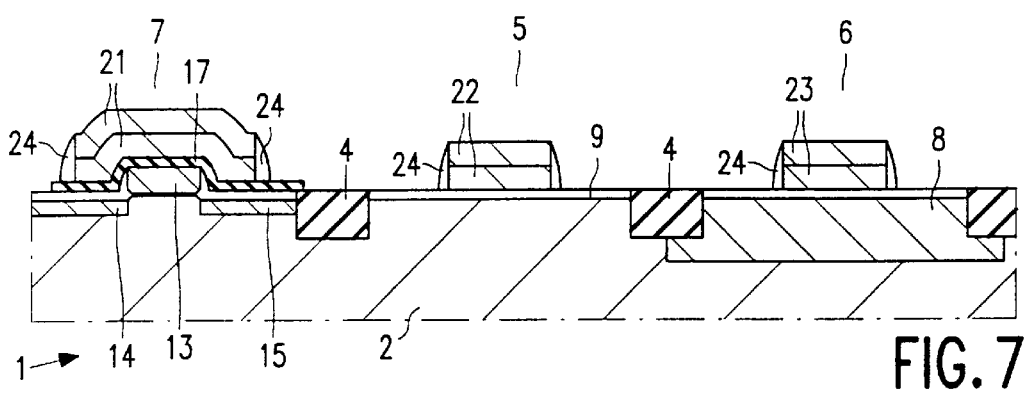

In a subsequent step, an etching mask (not shown in the drawing) is provided which defines the control electrode of the memory cell, the gate electrode of the n-channel MOST in the active region 5 and the gate electrode of the p-channel MOST in the active region 6. The exposed poly is removed in a customary manner by etching, thereby forming the control electrode 21 (see FIG. 7) in the active region 7, the gate electrode 22 in the active region 5 and the gate electrode 23 in the active region 6. After removal of the etching mask, the walls of the poly material are covered with an approximately 10 nm thick oxide layer 24 by thermal oxidation. The device obtained at this stage of the process is shown in FIG. 7.

Figure 8:
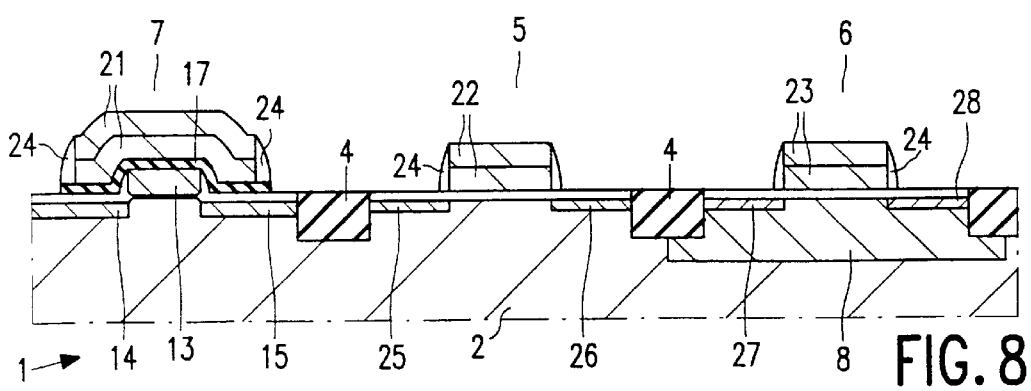

The parts of the oxynitride layer 17 which are not covered by the control electrode 21 can be removed in a selective etching process. Subsequently, a mask, not shown in the drawing, is provided which covers the active regions 6 and 7 and which leaves the active region 5 of the n-channel MOST exposed. In this region, an n-type LDD implantation (Lightly Doped Drain) is carried out to obtain the lightly doped n-type regions 25 and 26 in the active region 5. The mask is removed and a new mask (not shown either) is provided which covers the active regions 5 and 7 and which leaves the active region 6 exposed. By means of a light boron implantation, the lightly doped p-type LDD regions 27 and 28 are provided in the n-type well 8. After removal of the mask, the situation shown in FIG. 8 is obtained.

Figure 9:
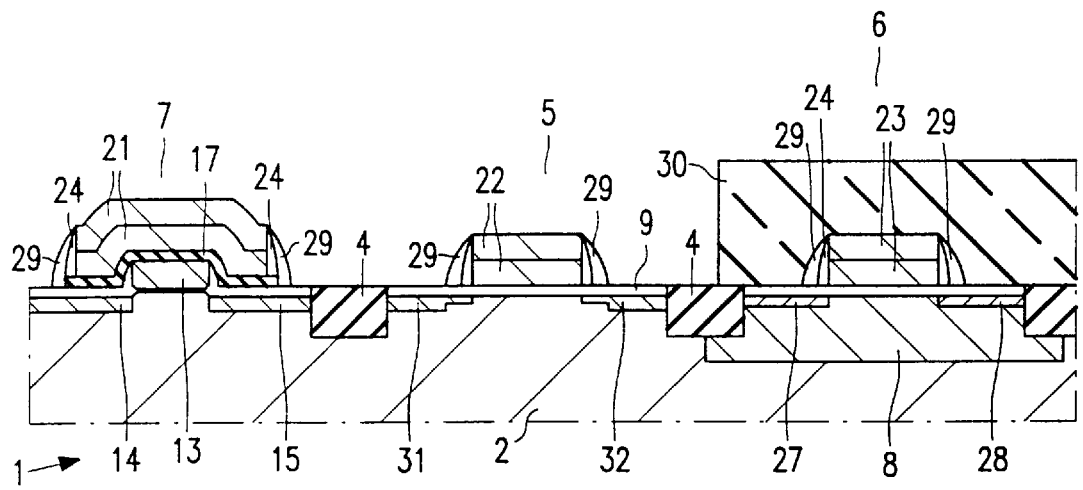
Figure 10:
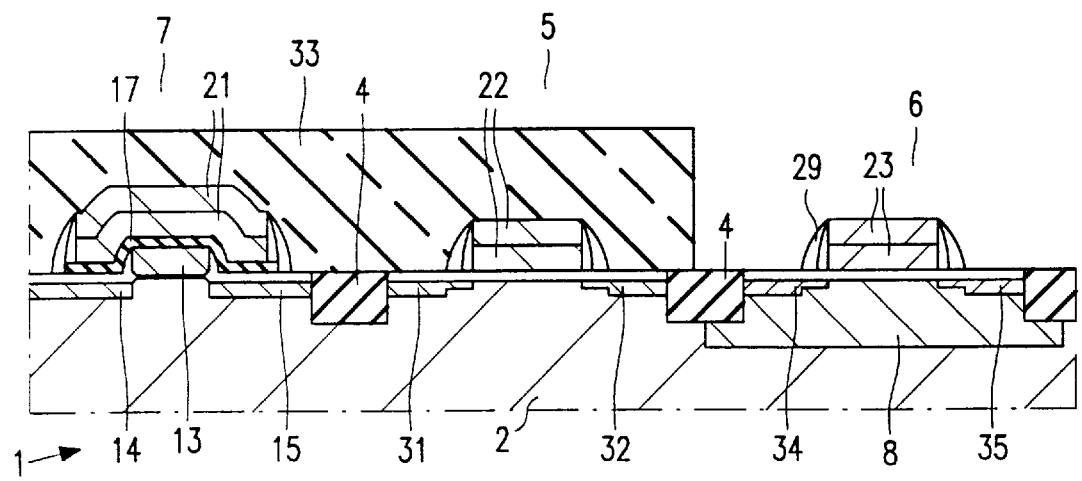

In a subsequent stage, shown in FIG. 9, the side walls of the gate electrodes 21–23 are provided with spacers 29. These spacers can be formed in a customary manner, for example by deposition and anisotropically etching back a glass layer. Next, the active region 6 of the p-channel MOST is covered with a mask 30. By implantation of As ions having an implantation dose, for example, of $4.10^{15}$ atoms per cm$^2$, the highly doped source and drain zones 31 and 32 of the n-channel MOST are provided. This implantation process is also carried out in the gate electrodes 21 and 22, so that these electrodes are highly doped with an n-type dopant. Subsequently, the mask 30 can be removed and replaced by the mask 33 (see FIG. 10) which covers the active regions 5 and 7 of, respectively, the n-channel MOST and the memory cell, and which leaves the active region 6 of the p-channel MOST exposed. By the implantation of B ions having an implantation dose of $4.10^{15}$ per cm$^2$, the highly doped p-type source and drain zones 34 and 35 of the p-channel MOST are provided. Simultaneously, the gate electrode 23 is redoped by the implantation dose, so that the gate electrode 23 becomes p-type conductive. After the implantation, the mask 33 can be removed, whereafter the device is subjected to further, standard operations such as, if necessary, the formation of metal silicides on various zones in the semiconductor body 1 and on various poly paths, the provision of a glass layer, the formation of contacts via this glass layer and the provision of the interconnection between various circuit elements. These steps are generally known and, therefore, not shown in the drawing.

The process described herein is important, in particular, for integrated circuits having an "embedded" memory. As explained in the description, the properties of the memory can be optimized without degradation of the properties of the CMOS logic by manufacturing the major part of the memory before carrying out the CMOS process. It is noted, in particular, that the use of a poly I layer having a relatively low doping concentration, which does not have a negative effect on the floating gate electrode, and locally masking the poly I layer against the heavy source/drain implantation in the memory, enables a p-type doped gate to be formed in the p-channel MOST. This has the important advantage that the threshold voltage in the p-channel MOST is low, so that, even at a relatively low supply voltage, the transistor can be brought into the non-conducting state.

It will be obvious that the invention is not limited to the above-described example, and that, within the scope of the invention, many variations are possible to those skilled in the art. For example, the semiconductor layer from which the floating gate is formed may alternatively be of the p-type, said layer, i.e. at least the part which forms the gate of the n-channel MOST, being redoped during the implantation of the n-type source and drain zones. The invention can also advantageously be used in embodiments without the LDD implantation in the CMOS transistors. Instead of the mask 12, it is alternatively possible to use the oxynitride layer 11 as the implantation mask to preclude the heavy As implantation for the source/drain zones 14, 15 from reaching the poly I layer in the active regions 5 and 6. The thickness of the layer 11 and the implantation energy should be attuned to each other.

We claim:

1. A method of manufacturing a semiconductor device comprising a semiconductor body one surface of which is provided with a pair of transistors in the form of an n-channel MOST in a first active region and a p-channel MOST in a second active region, in combination with a non-volatile memory cell in the form of a MOST having a floating gate in a third active region, characterized by the following steps:

providing a gate dielectric onto the surface of the semiconductor body in the first, second and third active regions;

forming a semiconductor layer with a relatively weak dopant concentration on the dielectric layer;

providing a mask which defines the floating gate in the semiconductor layer and which masks the parts of the semiconductor layer of the first and the second active region;

etching of unmasked parts of the semiconductor layer thereby providing the floating gate with a pattern and removing the semiconductor layer situated above surface parts of the third active region next to the floating gate, while the first and the second active region remain completely covered by the semiconductor layer;

providing a dopant having a relatively high dopant concentration in the uncovered parts of the third active region so as to obtain source and drain zones of a specific conductivity type for the MOST having a floating gate, during this doping step, at least portions of the semiconductor layer situated above the first and the second active region being masked against doping;

forming the gates of the n-channel MOST and the p-channel MOST, and providing the n-type source and drain zones of the n-channel MOST and the p-type source and drain zones of the p-channel MOST by locally providing (a) dopant(s);

providing the semiconductor layer situated above the first active region with an n-type dopant and the semiconductor layer situated above the second active region with a p-type dopant.

2. A method as claimed in claim 1, characterized in that the gate of the n-channel MOST is doped at the same time as the n-type source and drain zones of the n-channel MOST, and in that the gate of the p-channel MOST is doped at the same time as the p-type source and drain zones of the p-channel MOST.

3. A method as claimed in claim 2, characterized in that the semiconductor layer is provided with a relatively weak n-type dopant concentration, with the portion of the semiconductor layer which forms the gate of the p-channel MOST being redoped by giving it a p-type doping.

4. A method as claimed in claim 3, characterized in that the memory cell is provided with a control electrode which is situated above the floating gate and which is separated from said gate by an intermediate electrically insulating layer, a second semiconductor layer being provided for the control electrode, which semiconductor layer forms a continuous semiconductor layer with the above-mentioned first semiconductor layer at the location of the first and the second active region, and the gates of the n-channel MOST and the p-channel MOST being formed from this common semiconductor layer.

5. A method as claimed in claim 4, characterized in that the second semiconductor layer is provided by deposition of a first partial layer and a second partial layer, after the first deposition operation and before the second deposition operation, portions of the first partial layer situated above the first and the second active region being removed, so that at the location of these active regions, the second partial layer is deposited directly onto the first semiconductor layer.

6. A method as claimed in claim 5, characterized in that the first semiconductor layer and the first and the second partial layer of the second semiconductor layer are provided in equal or substantially equal thicknesses.

7. A method as claimed in claim 1, characterized in that the semiconductor layer is provided with a relatively weak n-type dopant concentration, with the portion of the semiconductor layer which forms the gate of the p-channel MOST being redoped by giving it a p-type doping.

8. A method as claimed in claim 7, characterized in that the memory cell is provided with a control electrode which is situated above the floating gate and which is separated from said gate by an intermediate electrically insulating layer, a second semiconductor layer being provided for the control electrode, which semiconductor layer forms a continuous semiconductor layer with the abovementioned first semiconductor layer at the location of the first and the second active region, and the gates of the n-channel MOST and the p-channel MOST being formed from this common semiconductor layer.

9. A method as claimed in claim 8, characterized in that the second semiconductor layer is provided by deposition of a first partial layer and a second partial layer, after the first deposition operation and before the second deposition operation, portions of the first partial layer situated above the first and the second active region being removed, so that at the location of these active regions, the second partial layer is deposited directly onto the first semiconductor layer.

10. A method as claimed in claim 9, characterized in that the first semiconductor layer and the first and the second partial layer of the second semiconductor layer are provided in equal or substantially equal thicknesses.

* * * * *